United States Patent [19]

Allen

[11] Patent Number: 5,429,987
[45] Date of Patent: Jul. 4, 1995

[54] METHOD FOR PROFILE CONTROL OF SELECTIVE METALLIZATION

[75] Inventor: Gregory L. Allen, Vancouver, Wash.

[73] Assignees: Sharp Microelectronics Technology, Inc., Camas, Wash.; Sharp Kabushiki Kaisha, Osaka, Japan

[21] Appl. No.: 8,745

[22] Filed: Jan. 25, 1993

[51] Int. Cl.[6] ............................................. H01L 21/44
[52] U.S. Cl. .................................... 437/187; 437/238; 437/245; 437/192
[58] Field of Search .................. 437/187, 44, 238, 192, 437/245

[56] References Cited

U.S. PATENT DOCUMENTS

| | | | |
|---|---|---|---|
| 4,419,809 | 12/1983 | Riseman et al. | |
| 4,784,718 | 11/1988 | Mitani et al. | 437/238 |
| 5,070,029 | 12/1991 | Pfiester et al. | 437/193 |
| 5,077,236 | 12/1991 | Kim | 437/228 |
| 5,240,879 | 8/1993 | De Bruin | 437/192 |
| 5,314,832 | 5/1994 | Deleonibus | 437/27 |

OTHER PUBLICATIONS

Copper Interconnection with Tungsten Cladding for ULSI, Cho, Kang, Beiley, Wong and Ting 1991 Symposium VLSI Technology, Oiso, Japan pp. 37–40.
Encapsulated Copper Interconnection Devices Using Sidewall Barriers, Gardner, Onuki, Kudoo, Misawa 1991 VMIC Conference Proceedings (IEEE) Jun. 11, 1991 pp. 99–108.

Primary Examiner—Olik Chaudhuri
Assistant Examiner—C. Everhart
Attorney, Agent, or Firm—Fliesler, Dubb, Meyer and Lovejoy

[57] ABSTRACT

A method for forming interconnects in an integrated circuit chip which includes a plurality of active devices over which a layer of dielectric material is deposited. The method comprises: (a) depositing a selective nucleating layer on the dielectric layer; (b) depositing a sacrificial layer over the nucleating layer; (c) patterning the sacrificial layer and nucleating layer such that the resulting pattern of the nucleating layer and sacrificial layer is equivalent to the desired pattern of conductive lines; (d) depositing a sidewall guide material over the patterned sacrificial and nucleating layers; (e) forming sidewall guides; (f) removing the sacrificial layer; and (g) depositing conductive material between the sidewall guides and on the nucleating layer. The nucleating layer may comprise titanium nitride, the sacrificial layer may comprise silicon dioxide, the sidewall guide material may comprise silicon nitride, and the conductive material may comprise copper. In another aspect of the invention, a layer of silicon nitride may be provided over the conductive material.

16 Claims, 2 Drawing Sheets

METHOD FOR PROFILE CONTROL OF SELECTIVE METALLIZATION

BACKGROUND OF THE INVENTION

1. Field of the Invention

The invention relates to the formation of integrated circuit devices, and specifically to improvements in the process used to manufacture connecting metals in such devices.

2. Description of the Related Art

As integrated circuit device manufacturers continually strive to integrate ever more device components into limited chip sizes, device interconnects have increasingly become an important design consideration. Essentially, such interconnects comprise the "wiring" for the component parts of the circuits on such chip by coupling the components to other such components in the overall device. Indeed, in ultra large scale integration (ULSI) devices having dimensions on the order of 1 micron or less, interconnects define the limits in performance, density and reliability, and are thus required to have very low electrical resistivity and high reliability.

Interconnect structures are generally desired to have good adhesion to the top surface of the wafer (which generally comprises a dielectric layer such as $SiO_2$), be relatively easy to pattern, be of high purity, and make good electrical contact with the wafer material. A number of different metals, (most often aluminum), composite materials, (such as aluminum/silicon/copper alloys and refractory metal silicides), and doped polysilicon, have all been utilized as interconnects, each having various advantages and disadvantages.

Various methods of depositing such interconnects on the wafer surface have been utilized. One desirable processing technique is chemical vapor deposition (CVD). CVD offers such advantages as the use of low maintenance machinery, the provision of conformal step coverage, and high speed production. However, in utilizing CVD to deposit metal layers for use as interconnects, it has been found that the resulting cross-sectional profile of the deposited metal interconnect layer is generally hemispherical in form. A hemispherical profile reduces the integration efficiency of the interconnect since excess lateral area is required for the amount of interconnect material. Thus, it is desirable that the edge profile of the interconnect lines be vertical, or nearly vertical, to improve the packaging density of the integrated circuit device and to improve isolation of the interconnects. This criticality is enhanced by the decrease in spacing between the lines which follows from increased integration.

Copper is a material which has been suggested for use as an interconnect since it achieves many of the above-mentioned desirable interconnect characteristics. As noted in an article entitled "New OMCVD Precursors For Selective Copper Metallization", Norman et al., IEEE No. TH-0359-0/91/0000-0123, (Jun. 11–12, 1991 VMIC Conference), copper interconnects may be selectively deposited in low temperature CVD processes, making the use of copper attractive from a manufacturing point of view as well. In general, the process of depositing copper as an interconnect involves first depositing a selective nucleation layer to provide for selective deposition of copper. A number of materials are suitable for use as the nucleating layer, such as tungsten, titanium nitride, and tantalum are suitable for this purpose.

Attempts to control the hemispherical profile of copper using sidewall barriers have also been suggested. The article entitled "Encapsulated Copper Interconnection Devices Using Sidewall Barriers," Gardner, et al. IEEE No. TH-0359-0/091/0000-0099, (Jun. 11–12, 1991 VMIC Conference), describes an interconnect structure wherein copper is encapsulated by an upper and lower layer of barrier material, and wherein sidewall barriers are used to prevent lateral or horizontally oriented hillocks. The method disclosed therein involves (a) providing a layer of barrier material over the dielectric material overlying a wafer surface; (b) providing a low resistivity conductor (such as copper) over the barrier layer; (c) providing a second layer of barrier material over the low resistivity material; (d) patterning the composite layer by dry etch or (for copper) ion milling followed by dry etching; and finally (e) forming sidewall barriers by (1) depositing a thin layer of molybdenum or SiN, and (2) anisotropic etching to leave sidewall material. While the aforementioned process achieves the results desired of a interconnect while preventing lateral diffusion, the method chosen for fabrication involves a significant number of steps resulting in increased costs to achieve the desired results of an improved interconnect structure.

SUMMARY OF THE INVENTION

Thus an object of the invention is to provide an improved method for fabricating integrated circuit devices.

A further object of the invention is to provide an improved method for fabricating interconnect layers, and specifically metal interconnect layers.

An additional object of the invention is to provide the above objects in a method for forming interconnect layers of low resistivity metals utilizing a reduced number of steps over prior art processes.

Yet another object of the invention is to provide the above objects wherein the interconnect layers are suitable for use with ULSI applications, where the dimensions of the devices are on the order of one micron or less.

These and other objects of the invention are provided in a method for forming interconnects in an integrated circuit chip. In general, the chip includes a plurality of active devices over which a layer of dielectric material is deposited. The method comprises: (a) disposing a selective nucleating layer on the dielectric layer; (b) disposing a sacrificial layer over the nucleating layer; (c) patterning the sacrificial layer and nucleating layer such that the resulting pattern of the nucleating layer and sacrificial layer is equivalent to the desired pattern of conductive lines; (d) depositing a sidewall guide material over the patterned sacrificial and nucleating layers; (e) forming sidewall guides; (f) removing the sacrificial layer; and (g) depositing conductive material between the sidewall guides and on the nucleating layer.

In one embodiment, the nucleating layer comprises titanium nitride, the sacrificial layer is silicon dioxide, the sidewall guide material is silicon nitride, and the conductive material is copper. In another aspect of the invention, a layer of silicon nitride may be provided over the conductive material.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENT

The invention comprises a novel method for fabricating metal interconnect layers, wherein the metal used is a low resistivity metal capable of selective deposition utilizing conventional chemical vapor deposition (CVD) processes. Conventional CVD processes result in a profile of deposited metals which is hemispherical, which makes it difficult to isolate the interconnect lines on a wafer surface. It is thus desireable for the interconnect lines to be formed with vertical side walls to allow for decreases in the spacing necessary between the interconnects. CVD processes are advantageously utilized in the manufacture of interconnect structures because of their simplicity of use and cost effectiveness. The process of the present invention incorporates CVD processing to allow for substitution of selective metal into existing semiconductor processes without additional masking steps. In addition, processing of the interlevel dielectric can be accomplished without significant changes in the semiconductor process. The goal of the invention is the simplification of the processing necessary to bring selective chemical vapor deposition of interconnect materials to a manufacturable state.

Figure 1:
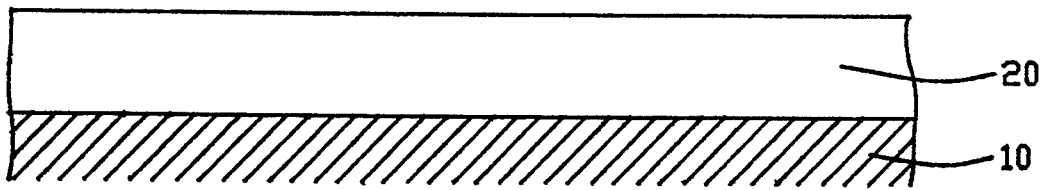
FIG. 1 is a cross-sectional view of a integrated circuit wafer having a layer of insulator provided thereon.

The method of the present invention will be described with reference to the FIGS. 1-7. FIG. 1 shows a semiconductor substrate 10 having deposited thereon an interlevel dielectric 20. Generally, the interlevel dielectric 20 will comprise a material such as silicon dioxide ($SiO_2$). As generally understood, the interlevel dielectric overlies a series of active devices which have been formed on a silicon wafer. In the formation of interconnects on the wafer, via holes (not shown) will be provided through the interlevel dielectric 20 to allow the interconnect to contact desired active portions of the devices formed on underlying wafer 10. As will be described below, the process of the present invention utilizes CVD which allows for effective filling of the via holes and conformal coverage of high aspect ratio sub-micron surface features.

Figure 2:
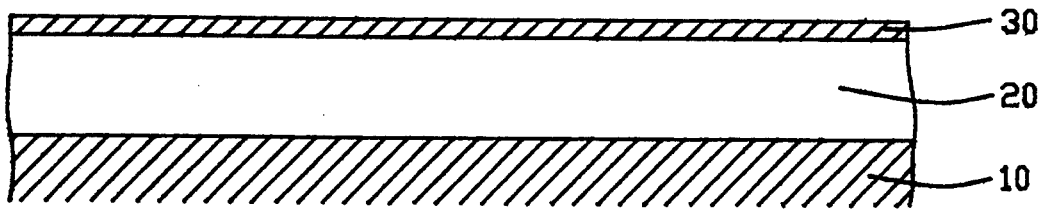
FIG. 2 is a cross-sectional representation of the wafer and insulator of FIG. 1 having a barrier layer provided thereon.

As shown in FIG. 2, a selective nucleation layer 30 is deposited onto dielectric layer 20. Selective nucleation layer 30 can be comprised of titanium nitride ($Ti_3N_4$ or similar) in a thickness sufficient to achieve the purposes of the invention. Alternatively, layer 30 may be comprised of molybdenum-, tungsten-, tantalum-, aluminum-, or platinum silicide, each being a material which can be easily removed in relation to the surface of dielectric layer 20. Selective nucleation layer 30 may be deposited onto the surface of dielectric layer 20 through conventional CVD, evaporation, sputtering or "physical vapor deposition" (PVD), or electrolytic processes. For example, in one embodiment, layer 30 comprising of titanium nitride would be deposited onto the surface of dielectric layer 20 by reactive sputtering from a titanium target in an atmosphere supplied with a flow of 35 sccm $N_2$ and 65 sccm Argon, at a pressure of 3 mTorr and a temperature of 300° C., by applying 3 kW of power to the target to induce a sputtering plasma.

Figure 3:
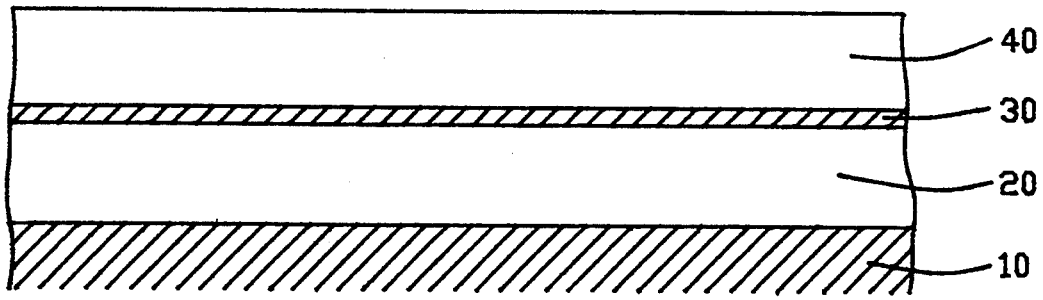
FIG. 3 is a cross-sectional representation of the barrier layer of FIG. 2 having a sacrificial layer provided thereon.
Figure 4:
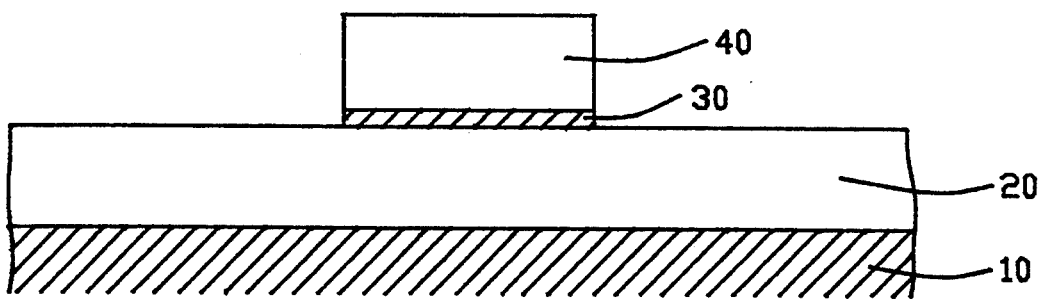
FIG. 4 is a cross-sectional representation of the structure of FIG. 3 after patterning.

As shown in FIG. 3, a sacrificial layer 40 is subsequently deposited onto the surface of the selective nucleation layer 30. Sacrificial layer 40 is utilized in patterning selective nucleation layer 30, and will act as a mold for forming side wall barriers used for profile control. Thus, sacrificial layer 40 should be formed to have a thickness which is equal to the desired thickness of the interconnect structure ultimately desired. Sacrificial layer 40 should comprise a material that is easily removed in relation to the dielectric or nucleation layer. Such materials can include conventional spin-on glass (SOG) layers, and ozonated tetraethylorthosilicate (TEOS) oxide. Sacrificial layer 40 may be deposited by conventional CVD process (for the TEOS layer) or spin-on techniques. In one embodiment, the TEOS oxide may comprise silicon dioxide ($SiO_2$) provided on the surface using a plasma enhanced CVD process, by placing the wafer in a process chamber supplied with a flow of 8 sccm oxygen and 2.5 sccm TEOS, at a temperature of 400° C., and a pressure of 2.5 Torr, and supplying 1 Kw of power. As shown in FIG. 4, sacrificial layer 40 and nucleation layer 30 are thereafter patterned with the ultimately desired pattern of the interconnect structure. Conventional lithographic and etching techniques may be readily utilized to accomplish this step. For example, reactive ion etching is suitable for this purpose, and may be performed by placing the wafer in a planar plasma reaction in an atmosphere supplied with a flow of 30 sccm $CHF_3$, 4 sccm $SF_6$ and 125 sccm He, at 1.8 Torr, and supplying 625 kW RF power. The remaining portions of sacrificial layer 40 and nucleation layer 30 will comprise the interconnect pattern.

Figure 5:
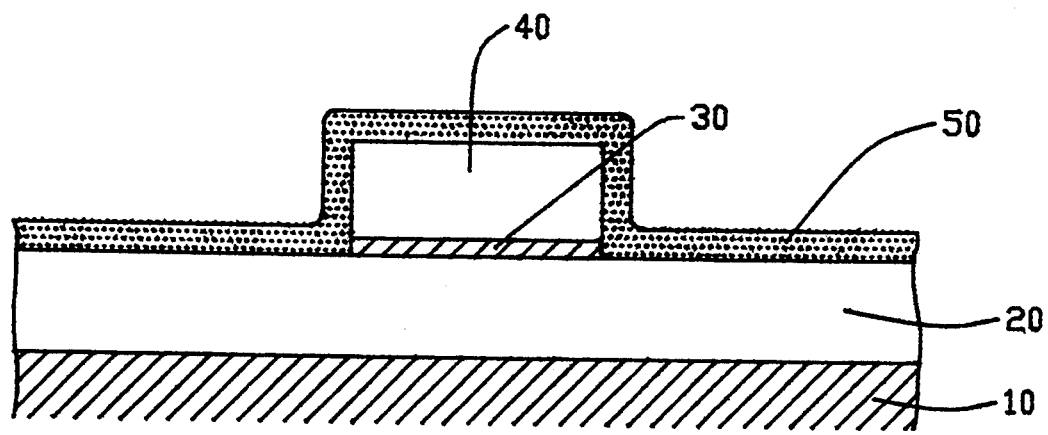
FIG. 5 is a cross-sectional representation of the patterned structure of FIG. 4 having a barrier layer provided thereon.

As shown in FIG. 5, side wall material 50 is deposited over the patterned selective layer 40 and nucleation layer 30 onto the surface of dielectric 20. The material chosen to create the side wall guide is preferably silicon nitride (SIN). However, any suitable material which is inert to nucleation of the chemical deposition of the interconnect metal chosen for the process may be utilized. Silicon nitride may be deposited by conventional PECVD processing, at a pressure of 2.6 Torr and at a temperature of about 400° C. in an atmosphere supplied with 4 sccm $NH_3$, 0.5 sccm $SiH_4$, and 1 kW RF power.

Figure 6:
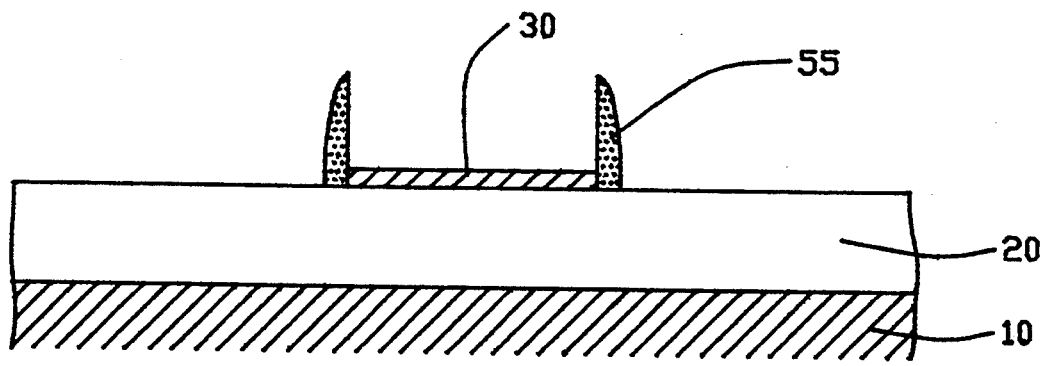
FIG. 6 is a cross-sectional representation of the structure of FIG. 5 after patterning to form side wall barriers.

As shown in FIG. 6, a directional dry etch is used to create the side wall spacer 55 from side wall material 50. Again, a RIE is suitable for this purpose, and may be performed by placing the wafer in an atmosphere supplied with a flow of 30 sccm $CHF_3$, 4 sccm $SF_6$ and 125 sccm He, at a pressure of 1.8 Torr, and 625 kW RF power to ignite the plasma. Subsequently, sacrificial layer 40 is removed by a conventional selective wet etch process such as a HF bath dip. As shown in FIG. 6, the final structure before chemical vapor deposition of the interconnect metal consists of a patterned nucleation layer 30 outlined with the side wall guide materials 55.

Figure 7:
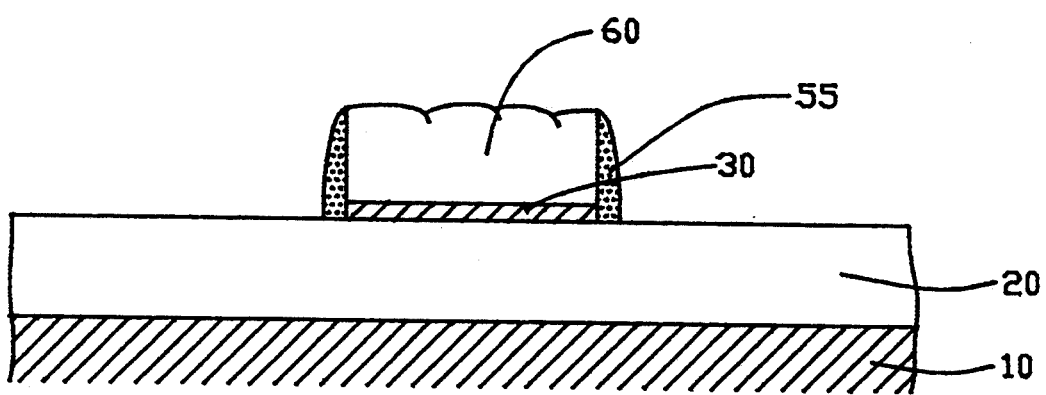
FIG. 7 is a cross-sectional representation of the structure of FIG. 6 subsequent to deposition of the interconnect metal.

Finally, as shown in FIG. 7, low pressure chemical vapor deposition may be utilized to deposit the interconnect metal 60 such as copper into and between the side wall guides. For example, a metallo-organic CVD process in a chamber supplied with a flow of 0.1 sccm Cu (hexafluoroacetylacetonate) trimethylvinylsilane and 0.5 Slm He, at a temperature of 125° C. and pressure of 100 mTorr is suitable. As discussed in the prior art, copper will selectively deposit onto the nucleation layer 30 in this process and is advantageously used as a metal interconnect.

The various features and advantages of the present invention will be apparent to those skilled in the art. Various materials may be used for different process components. The nucleation layer 30, described above as comprising titanium nitride, may compose any metal that can be successfully patterned by dry etching, as discussed above. The interconnect metal 60 may also comprise chemical vapor deposited tungsten. The sacrificial layer 40 may comprise low density spin-on-glass (SOG) layers or low density ozone - reacted oxides. If required to decrease the removal of the underlying dielectric, a silicon nitride layer can be added before deposition of nucleating layer 30. It is particularly important that the side wall material does not facilitate the nucleation of the CVD metal, and that it is not removed during the wet etch of the sacrificial material removed between the side wall spacers. Chemical vapor deposited silicon nitride meets these requirements and also prevents diffusion of the copper when used as a CVD metal. Complete encapsulation of the final structure may be accomplished by an additional layer of silicon nitride over the copper layer 60. Other features and advantages of the invention are intended to be within the definition of the invention as discussed in the instant specification and the following claims.

I claim:

1. In a process for manufacturing an integrated circuit device wherein a series of manufacturing steps results in an insulating layer overlying at least one active device, a method of depositing material to couple the active devices in a selected manner, comprising:
   (a) depositing a selective nucleation layer of titanium nitride on the surface of the insulating layer;
   (b) forming vertically oriented sidewalls about the selective nucleation layer to define a region between the sidewalls for the material;
   (c) depositing the material within the sidewalls; and
   (d) removing the sidewalls.

2. The method of claim 1 wherein said step (b) comprises the steps of
   depositing an inert layer over the selective nucleation layer,
   patterning the inert layer and the selective nucleation layer leaving a portion of the insulating layer exposed,
   depositing a sidewall material over the patterned inert layer, selective nucleation layer, and insulating layer,
   removing the inert layer a portion of and the sidewall material overlying the portion of the insulating layer.

3. The method of claim 2 wherein the step of depositing the sidewall material includes forming sidewalls adjacent the patterned inert layer and selective nucleation layer.

4. The method of claim 1 wherein said step (c) includes the step of selectively depositing copper between the sidewalls.

5. The method of claim 4 further including the step of depositing a layer of silicon nitride over the copper.

6. A method of selectively depositing a conductive metal for use in integrated circuit fabrication, comprising:
   (a) depositing a selective nucleation layer on the surface of a dielectric layer;
   (b) depositing a sacrificial oxide layer over the selective nucleation layer, the sacrificial oxide having a preselected thickness;
   (c) patterning the sacrificial oxide and selective nucleation layers with an interconnect pattern desired for the conductive layer;
   (d) depositing an inert material over the patterned surface;
   (e) etching the inert material to create sidewall spacers adjacent the patterned regions of sacrificial oxide;
   (f) selectively etching the sacrificial oxide; and
   (g) selectively depositing a conductive material on the selective nucleation layer.

7. The method of claim 6 wherein said step (a) comprises reactively sputtering titanium nitride as the selective nucleation layer.

8. The method of claim 6 wherein said step (b) comprises depositing a silicon dioxide layer through plasma enhanced chemical vapor deposition.

9. The method of claim 6 wherein said step (d) comprises depositing silicon nitride by plasma enhanced chemical vapor deposition.

10. The method of claim 6 wherein said step (g) comprises selecting copper trimethylvinylsilane.

11. A method for forming interconnects in an integrated circuit chip, the chip including a plurality of active devices over which a layer of dielectric material is deposited, comprising:
   (a) depositing a selective nucleating layer on the dielectric layer;
   (b) depositing a sacrificial layer over the nucleating layer;
   (c) patterning the sacrificial layer and nucleating layer such that the resulting pattern of the nucleating layer and sacrificial layer is equivalent to the desired pattern of conductive lines;
   (d) depositing a sidewall guide material over the patterned sacrificial and nucleating layers;
   (e) forming sidewall guides;
   (f) removing the sacrificial layer; and
   (g) depositing conductive material between the sidewall guides and on the nucleating layer.

12. The method of claim 11 wherein said step (e) comprises the steps of
   depositing an inert layer over the selective nucleation layer,
   patterning the inert layer and the selective nucleation layer leaving a portion of the dielectric material exposed, depositing a sidewall material over the patterned inert layer, selective nucleation layer, and dielectric material, removing the inert layer and a portion of the sidewall material overlying the dielectric material.

13. The method of claim 12 wherein step (g) includes selectively depositing a metal interconnect layer which nucleates with the selective nucleation layer to form an interconnect layer between the sidewalls.

14. The method of claim 13 further including the step of (h) depositing a layer of silicon nitride over the metal interconnect.

15. A method comprising:
(a) providing a semiconductor substrate having a plurality of active components formed thereon;
(b) depositing a nucleating layer over the semiconductor substrate;
(c) patterning the nucleating layer;
(d) forming vertically oriented sidewalls about the nucleating layer; and
(e) depositing a conductive material within the vertical sidewalls such that the conductive material selectively deposits within the sidewalls due to the presence of the nucleating layer thereinbetween.

16. A method comprising:
(a) depositing a layer of titanium nitride on the surface of a dielectric layer;
(b) depositing a layer of silicon dioxide over the titanium nitride layer;
(c) patterning the silicon dioxide and titanium nitride layers with an interconnect pattern;
(d) depositing a layer of silicon nitride over the patterned surface;
(e) etching the silicon nitride to create sidewall spacers adjacent the patterned regions of silicon dioxide;
(f) selectively removing the silicon dioxide by etching the silicon dioxide;
(g) depositing a conductive material which selectively deposits on the titanium nitride; and
(h) depositing a second layer of silicon nitride.

* * * * *

UNITED STATES PATENT AND TRADEMARK OFFICE
CERTIFICATE OF CORRECTION

PATENT NO. : 5,429,987
DATED : July 4, 1995
INVENTOR(S) : Gregory L. Allen

It is certified that error appears in the above-indentified patent and that said Letters Patent is hereby corrected as shown below:

Column 2, line 24, after "of" delete "a" and insert therefor --an--;
Column 3, line 8, after "of" delete "a" and insert therefor --an--;
Column 4, line 56, after "nitride" delete "(SIN)" and insert therefor --(SiN)--.

Signed and Sealed this

Nineteenth Day of March, 1996

Attest:

BRUCE LEHMAN

Attesting Officer     Commissioner of Patents and Trademarks